United States Patent [19]

Beitner

[11] 4,357,804
[45] Nov. 9, 1982

[54] THERMOELECTRIC DEVICE

[75] Inventor: Shlomo Beitner, Tel-Aviv, Israel

[73] Assignee: Bipol Ltd., Tel-Aviv, Israel

[21] Appl. No.: 236,550

[22] Filed: Feb. 20, 1981

[51] Int. Cl.³ .......................................... F25B 21/02
[52] U.S. Cl. ................................................. 62/3
[58] Field of Search ............................... 62/3; 357/87

[56] References Cited
U.S. PATENT DOCUMENTS 3,107,324 10/1963 Wright et al. ....................... 62/3 X
3,121,998 2/1964 Nagata ................................... 62/3
3,315,474 4/1967 Farer ...................................... 62/3
4,245,479 1/1981 Richter et al. ....................... 62/3 X Primary Examiner—Lloyd L. King
Attorney, Agent, or Firm—Gordon W. Hueschen

[57] ABSTRACT

There is disclosed a thermoelectric device powered by a direct current power supply in which the circuitry comprises an integrated timer circuit and a two-stage, feed-back amplifier which, when switched in, produces a digital direct current pulse for delivery to the thermoelectric device. An LED circuit is included to show when the integrated timer circuit is operating to deliver the desired current to the thermoelectric device.

6 Claims, 3 Drawing Figures

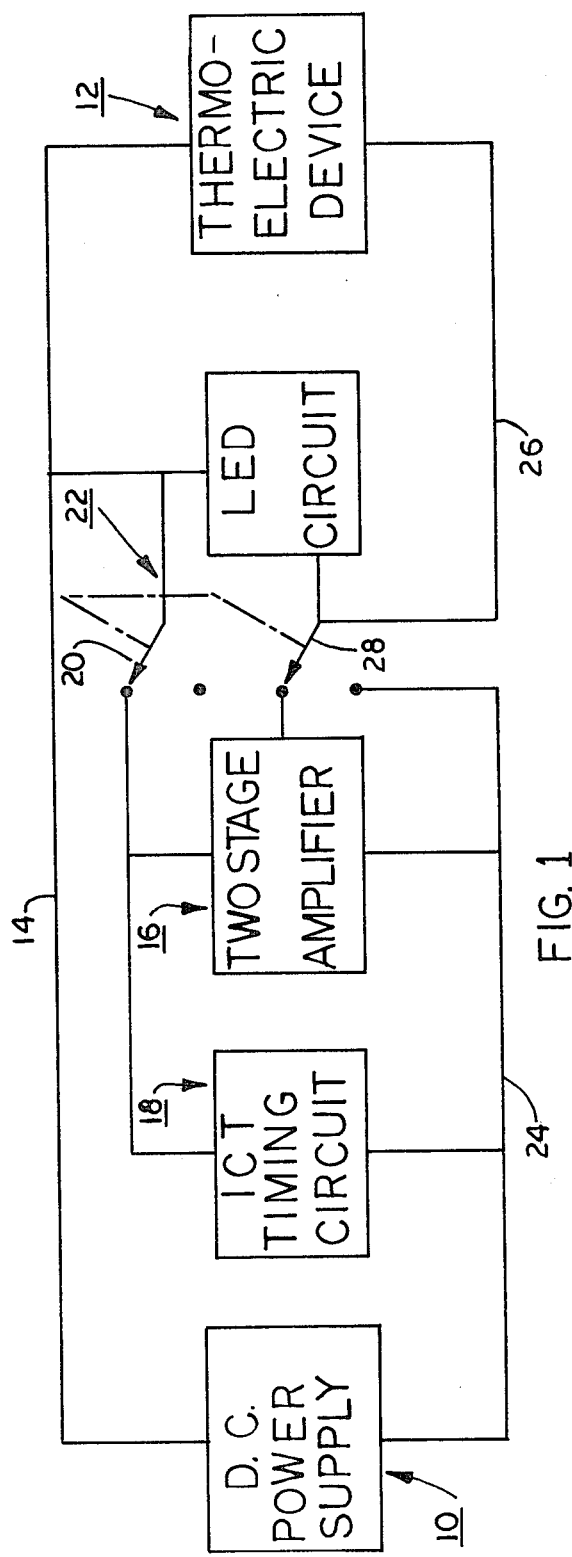
FIG. 1
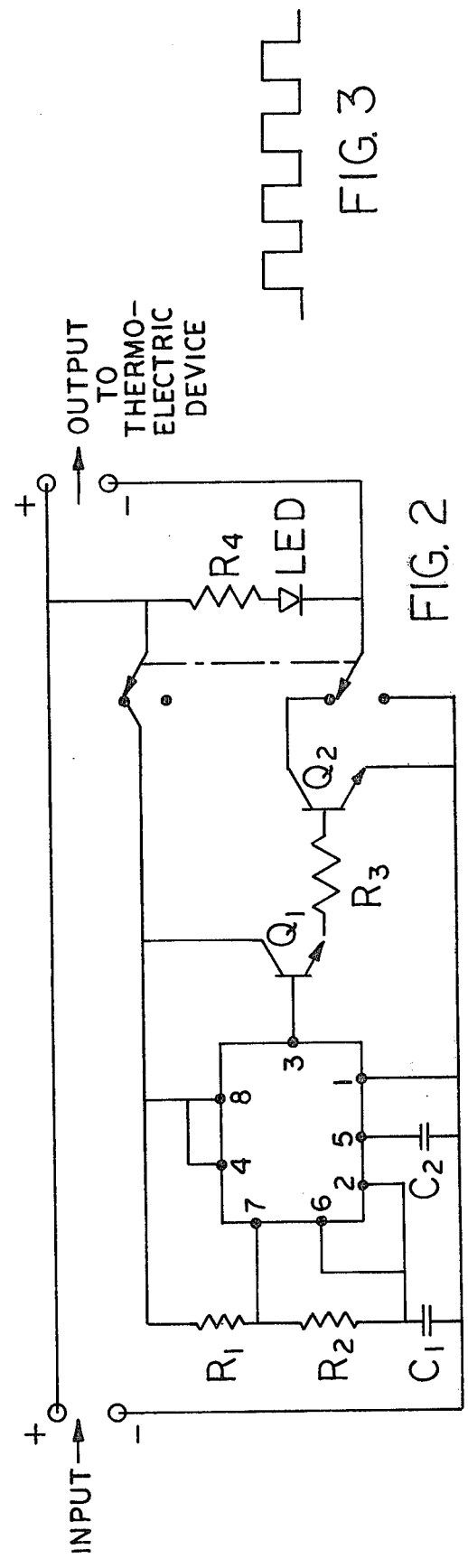
FIG. 3
FIG. 2

THERMOELECTRIC DEVICE

FIELD OF INVENTION AND PRIOR ART

This invention relates to a thermoelectric device comprising a thermoelectric element having a hot face and a cold face powered by a direct current.

In U.S. Pat. No. 4,107,934 and in the patents cited therein during the prosecution thereof, there are shown portable refrigerator units powered by a thermoelectric element actuated by a direct current potential, such as can be obtained from a car, a boat, or the like. Also, such thermoelectric elements have been suggested for use in bottle warmers and coolers, dental hot plate-cold plate devices, and in many other uses. Such units, however, have the disadvantage that when they are made portable, one has to rely upon a battery as the source of the direct current potential impressed across the faces of the thermoelectric element. Hence, the useful life of such portable units, without recharging or replacing the batteries, is substantially limited.

OBJECTS OF THE INVENTION

It is an object of the invention to provide a thermoelectric device of the class described in which battery drain is minimized. It is a further object of the invention to provide a thermoelectric device of the class described in which a continuous direct current is converted into a digital pulse. Further objects of the invention are to avoid the disadvantages of the prior art and to obtain such advantages as will appear as the description proceeds.

BRIEF DESCRIPTION OF THE INVENTION

The invention is directed to a thermoelectric device comprising a thermoelectric element having a hot face and a cold face, direct current supply means for impressing a direct current potential across the faces of the thermoelectric element and solid state means for converting the direct current into a digital pulse. Advantageously, the solid state means comprises an integrated timer circuit arranged to generate a digital pulse and a two-stage amplifier arranged to feed back an amplified, digital pulse to the integrated timer circuit.

Advantageously, the integrated timer circuit arrangement comprises a time-constant circuit comprising $R_1$, $R_2$ and $C_1$ in series with the $R_1$ end of the series connected with the positive terminal and the $C_1$ end with the negative terminal of the input; with the number 7 terminal of the integrated circuit timer connected between $R_1$ and $R_2$; with the number 2 and number 6 terminals of the integrated circuit timer connected between $R_2$ and $C_1$; and with the number 4 and 8 terminals of the integrated circuit timer connected with the positive input. Also, the number 3 output terminal of the integrated circuit timer is connected with the input of a two-stage solid state feed-back amplifier, the unamplified output of which is connected to the negative output to the integrated timer circuit. Advantageously, an LED, tell-tale circuit is connected across the output to the thermoelectric element and flashes on and off when it is also connected to the output of the integrated timer circuit to show that a digital pulse current is being delivered from that circuit.

Advantageously, a double-throw, double-pole switch is arranged so that one pole makes and breaks the power input to $R_1$ and the integrated timer, and the other pole switches the negative output to the thermoelectric element from the integrated timer circuit to the negative input when the first pole is switched from make to break.

BRIEF DESCRIPTION OF THE DRAWINGS

In the drawings:

FIG. 1 is a schematic view of the thermoelectric device of the invention;

FIG. 2 is a detailed schematic view of the circuitry of FIG. 1;

FIG. 3 is illustrative of the digital pulse produced and delivered to the thermoelectric device.

DETAILED DESCRIPTION OF THE INVENTION

Referring particularly to FIG. 1, at the left there is shown a direct current power supply 10 linked to deliver a direct current potential across the faces of the thermoelectric device 12. The positive pole of the direct current supply is connected through line 14 directly to the thermoelectric device and the LED circuit and to the two-stage, feed-back amplifier 16 and the integrated circuit timer 18 through one pole 20 of the double-throw, double-pole switch 22. The negative output of the direct current power supply is connected through line 24 to the integrated circuit timer and the two-stage amplifier and there through line 26 to the thermoelectric device. The pole 28 of the switch 22 is operative to switch the output of the power supply directly to the thermoelectric device and thus take the integrated timer and the two-stage, feed-back amplifier out of the circuit.

FIG. 2 shows details of the integrated circuit timer and the amplifier.

Thus, the positive input is directly connected to the positive output and to the amplifier and the integrated circuit timer. It also powers the LED circuit. When the double-throw, double-pole switch is in the closed position, the integrated circuit timer and the amplifier are in the circuit. When it is in the open position, they are switched out of the circuit. $R_1$, or $R_2$, and $C_1$, which are in series between the positive and the negative input in the order named, constitute the time-constant circuit. The number 7 terminal of the integrated circuit timer is connected between $R_1$ and $R_2$; terminals 6 and 2 are connected between $R_2$ and $C_1$; terminals 4 and 8 are connected to the positive input; terminal 1 is connected to the negative input, and terminal 5, optionally, is connected through condenser $C_2$ to the negative input. Terminal 3, the output terminal, is connected with the first stage $Q_1$ of the solid state amplifier, the output of which is fed through resistor $R_3$ to the second stage $Q_2$ of the amplifier, the output of which is fed back to the integrated timer circuit.

FIG. 3 illustrates a digital pulse curve of the character obtained by the circuitry shown in FIG. 2. A digital pulse is to be understood as one having a fixed potential, as determined by the power supply, which is interrupted at periodic intervals and for a time determined by the time-constant circuit. Thus, the time on and off of this curve is determined by the values of $R_1$, $R_2$, and $C_1$, and it will be understood that those skilled in the art are capable of selecting values for these elements according to the demand of the thermoelectric device. It will also be understood that the transistors $Q_1$ and $Q_2$ and the value of $R_3$ are such as can be determined by those skilled in the art. It is sufficient to say that a two-stage amplifier of the Darlington type can be used. This type of amplifier does not affect the potential but makes more current available for feed back into the integrated timer circuit. Similarly, the value for $R_4$ can be determined by those skilled in the art.

The LED circuit is connected across the output circuit so that the LED pulses when the negative output is connected to the two-stage amplifier and is steady when it is not.

It is to be understood that the invention is not to be limited to the exact details of construction, operation, or exact materials or embodiments shown and described, as obvious modifications and equivalents will be apparent to one skilled in the art, and the invention is therefore to be limited only by the full scope of the appended claims.

I claim:

1. A thermoelectric device comprising a thermoelectric element having a hot face and a cold face, power supply means for impressing a direct current potential across said faces, and solid state means comprising an integrated circuit timer for converting said direct current potential into a direct current digital pulse.

2. A thermoelectric device comprising a thermoelectric element having a hot face and a cold face, power supply means for impressing a direct current potential across said faces, and solid state means for converting said direct current potential into a direct current digital pulse, in which said solid state means comprises an integrated circuit timer arranged to feed back an amplified digital pulse to said integrated timer.

3. A thermoelectric device of claim 2, in which the integrated circuit timer arrangement comprises a time-constant circuit comprising $R_1$, $R_2$, and $C_1$ in series with the $R_1$ end of the series connected with the positive terminal and the $C_1$ end with the negative terminal of the input, with the number 7 terminal of the integrated circuit timer connected between $R_1$ and $R_2$, with the number 2 and number 6 terminals of the integrated circuit timer connected between $R_2$ and $C_1$, and with the number 4 and 8 terminals of the integrated circuit timer connected with the positive input.

4. A thermoelectric device of claim 3, in which the output terminal number 3 of the integrated circuit timer is connected with the input of a two-stage solid state amplifier, the amplified output of which is fed back to said integrated circuit timer.

5. A thermoelectric device of claim 4, in which an LED, tell-tale circuit is connected across the output to the thermoelectric element and flashes on and off when it is also connected to the direct current power supply through the two-stage amplifier to show that a digital pulse current is being delivered from said integrated circuit timer.

6. A thermoelectric device of claim 5, in which a double-throw, double-pole switch is arranged so that one pole makes and breaks the power input to the integrated timer circuit and the other pole switches the negative output to the thermoelectric element from the integrated timer circuit to the negative input of the direct current power supply when the first pole is switched from make to break.

* * * * *